(12) United States Patent
Su (10) Patent No.: US 12,167,533 B2
(45) Date of Patent: Dec. 10, 2024

(54) METAL FOIL WITH CARRIER AND PREPARATION METHOD THEREOF

(71) Applicant: GUANGZHOU FANGBANG ELECTRONICS CO., LTD., Guangdong (CN)

(72) Inventor: Zhi Su, Guangdong (CN)

(73) Assignee: GUANGZHOU FANGBANG ELECTRONICS CO., LTD., Guangdong (CN)

( * ) Notice: Subject to any disclaimer, the term of this patent is extended or adjusted under 35 U.S.C. 154(b) by 680 days.

(21) Appl. No.: 17/289,417

(22) PCT Filed: Nov. 6, 2019

(86) PCT No.: PCT/CN2019/116088
§ 371 (c)(1),
(2) Date: Apr. 28, 2021

(87) PCT Pub. No.: WO2020/119339
PCT Pub. Date: Jun. 18, 2020

(65) Prior Publication Data
US 2021/0392749 A1  Dec. 16, 2021

(30) Foreign Application Priority Data

Dec. 10, 2018  (CN) .......................... 201811514702.6

(51) Int. Cl.
*H05K 1/09* (2006.01)
*C23F 17/00* (2006.01)
(Continued)

(52) U.S. Cl.
CPC .............. *H05K 1/09* (2013.01); *C23F 17/00* (2013.01); *C25D 3/38* (2013.01); *C25D 5/10* (2013.01);
(Continued)

(58) Field of Classification Search
None
See application file for complete search history.

(56) References Cited

U.S. PATENT DOCUMENTS

| 2004/0038049 A1* | 2/2004 | Suzuki ................. C25D 7/0614 |
| | | 428/458 |
| 2009/0291319 A1* | 11/2009 | Nagatani ................. C25D 5/34 |
| | | 204/192.15 |

FOREIGN PATENT DOCUMENTS

| CN | 1466517 A | 1/2004 |
| CN | 105979710 A | 9/2016 |

(Continued)

OTHER PUBLICATIONS

Rohan—nickel deposition on copper—Appl.Surf.Sci.—2002 (Year: 2002).*

(Continued)

*Primary Examiner* — John Vincent Lawler
(74) *Attorney, Agent, or Firm* — Dennemeyer & Associates LLC; Victoria Friedman (57) ABSTRACT

A metal foil that has a carrier and a preparation method thereof. The metal foil with a carrier comprises a carrier layer, a barrier layer, a striping layer, and a metal foil layer. The carrier layer, the barrier layer, the striping lay, and the metal foil layer are sequentially stacked, or the carrier layer, the striping layer, the barrier layer, and the metal foil layer are sequentially stacked. The diffusion depth of the carrier layer to the metal foil layer is less than or equal to 3 μm and the diffusion depth of the metal foil layer toward the carrier layer is less than or equal to 3 μm at a temperature of 20-400° C. By setting the barrier layer, the carrier layer and the metal foil layer are prevented from diffusing mutually to cause bonding at a high temperature, so that the carrier layer and the metal foil layer are easy to peel off.

16 Claims, 6 Drawing Sheets

(51) Int. Cl.
*C25D 3/38* (2006.01)
*C25D 5/00* (2006.01)
*C25D 5/10* (2006.01)
*H05K 3/02* (2006.01)

(52) U.S. Cl.
CPC .............. *C25D 5/60* (2020.08); *H05K 3/022* (2013.01); *H05K 2201/0355* (2013.01)

(56) References Cited

FOREIGN PATENT DOCUMENTS

| | | | | |
|---|---|---|---|---|
| CN | 107249876 A | 10/2017 | | |
| CN | 108124391 A | 6/2018 | | |
| CN | 108541144 A | 9/2018 | | |
| JP | 2000269637 A | 9/2000 | | |
| JP | 2002292788 A | 10/2002 | | |
| JP | 4072431 B2 | 4/2008 | | |
| JP | 6415760 B2 | 10/2018 | | |
| KR | 2014/0023744 A | * | 2/2014 | .............. B32B 15/01 |
| WO | 02/24444 A1 | 3/2002 | | |
| WO | WO-2015122258 A1 | * | 8/2015 | ............... C25D 1/04 |
| WO | 2017/150283 A1 | 9/2017 | | |

OTHER PUBLICATIONS

Fujita—WO 2015-122258 A1—Jap.Off. Rej. D2—MT—carrier copper foil—2015 (Year: 2015).*
Su—CN 211378355—Biblio—stripping layer—Aug. 28, 2020 (Year: 2020).*
Yang—KR 2014-0023744 A—IDS—MT—copper clad w—multiple layers—2014 (Year: 2014).*
International Search Report issued in connection with PCT Application No. PCT/CN2019/116088 dated Jan. 31, 2020.

\* cited by examiner

METAL FOIL WITH CARRIER AND PREPARATION METHOD THEREOF

CROSS REFERENCE TO RELATED APPLICATIONS

This application is a national application of PCT/CN2019/116088, filed on Nov. 6, 2019. The contents of PCT/CN2019/116088 are all hereby incorporated by reference.

TECHNICAL FIELD

The disclosure relates to the technical field of materials, and in particular to a metal foil with a carrier and a preparation method thereof.

BACKGROUND

At present, a substrate is a processing material of a Flexible Printed Circuit board (FPC), which is generally composed of a flexible insulating base film and a metal foil with a carrier. When the substrate is prepared in the conventional art, a side of the metal foil (including a carrier layer and a metal foil layer) provided with the metal foil layer is firstly pressed with the flexible insulating base film to obtain the substrate, and the carrier layer needs to be peeled off when the substrate is used. However, due to the fact that the metal foil with a carrier and the flexible insulating base film need to be pressed at a high temperature, the carrier layer and the metal foil layer are easy to diffuse mutually at the high temperature, so that the carrier layer is bonded with the metal foil layer, and the carrier layer and the metal foil layer are difficult to peel off.

SUMMARY

The embodiments of the disclosure aim to provide a metal foil with a carrier and a preparation method thereof, which can avoid bonding caused by mutual diffusion of a carrier layer and a metal foil layer of the metal foil with a carrier at a high temperature so that the carrier layer and the metal foil layer are easy to peel off.

In order to solve the above technical problem, the embodiments of the disclosure provide a metal foil with a carrier, which includes a carrier layer, a barrier layer, a striping layer, and a metal foil layer.

The carrier layer, the barrier layer, the striping layer, and the metal foil layer are sequentially stacked; or, the carrier layer, the striping layer, the barrier layer, and the metal foil layer are sequentially stacked.

The diffusion depth of the carrier layer to the metal foil layer is less than or equal to 3 μm and the diffusion depth of the metal foil layer toward the carrier layer is less than or equal to 3 μm at a temperature of 20-400° C.

As a preferred solution, the diffusion depth of the carrier layer to the metal foil layer is less than or equal to 1 μm and the diffusion depth of the metal foil layer toward the carrier layer is less than or equal to 1 μm.

As a preferred solution, the carrier layer, the striping layer, the barrier layer, and the metal foil layer are sequentially stacked, and the peel strength between the metal foil layer and the barrier layer is greater than the peel strength between the striping layer and the barrier layer.

As a preferred solution, the barrier layer includes a high-temperature resistant layer, the high-temperature resistant layer is an organic high-temperature resistant layer, or the high-temperature resistant layer is made of any one or more of tungsten, chromium, zirconium, titanium, nickel, molybdenum, cobalt, and graphite.

As a preferred solution, the high-temperature resistant layer is a single-layer alloy structure or a multilayer structure formed by a single metal layer or a multilayer structure formed by an alloy layer and a single metal layer.

As a preferred solution, the carrier layer, the barrier layer, the striping layer, and the metal foil layer are sequentially stacked, the barrier layer further includes a metal bonding layer, and the metal bonding layer is disposed between the carrier layer and the high-temperature resistant layer.

As a preferred solution, the carrier layer, the striping layer, the barrier layer, and the metal foil layer are sequentially stacked, the barrier layer further includes a metal bonding layer, and the metal bonding layer is disposed between the high-temperature resistant layer and the metal foil layer.

As a preferred solution, the metal bonding layer is made of any one or more of copper, zinc, nickel, iron and manganese; or, the metal bonding layer is made of one of copper or zinc and one of nickel, iron and manganese.

As a preferred solution, the striping layer is made of any one or more of nickel, silicon, molybdenum, graphite, titanium, and niobium; or, the striping layer is made of an organic polymer material.

As a preferred solution, the thickness of the metal foil layer is less than or equal to 9 μm.

As a preferred solution, the metal foil layer is a copper foil or an aluminum foil; and/or, the carrier layer is copper or aluminum or an organic thin film.

As a preferred solution, the roughness Rz of a face of the carrier layer close to the metal foil layer is less than or equal to 5 μm; and/or the roughness Rz of a face of the metal foil layer away from the carrier layer is less than or equal to 3.0 μm.

As a preferred solution, a first anti-oxidation layer is disposed on a side of the carrier layer close to the barrier layer; and/or a second anti-oxidation layer is disposed on a side of the metal foil layer away from the barrier layer.

In the metal foil with a carrier provided by the embodiments of the disclosure, the carrier layer, the barrier layer, the striping layer, and the metal foil layer are sequentially stacked; or, the carrier layer, the striping layer, the barrier layer, and the metal foil layer are sequentially stacked; the diffusion depth of the carrier layer to the metal foil layer is less than or equal to 3 μm and the diffusion depth of the metal foil layer toward the carrier layer is less than or equal to 3 μm at a temperature of 20-400° C. The carrier layer is convenient to peel off by setting the striping layer, and the carrier layer and the metal foil layer are prevented from diffusing mutually to cause bonding at a high temperature by setting the barrier layer, so that the carrier layer and the metal foil layer are easy to peel off.

1, Carrier layer; 2, barrier layer; 21, high-temperature resistant layer; 22, metal bonding layer; 3, striping layer; 4, metal foil layer.

DETAILED DESCRIPTION OF THE EMBODIMENTS

The technical solutions in the embodiments of the disclosure will be clearly and completely described hereinbelow with the drawings in the embodiments of the disclosure. It is apparent that the described embodiments are only part of the embodiments of the disclosure, not all of the embodiments. On the basis of the embodiments of the disclosure, all other embodiments obtained on the premise of no creative work of those of ordinary skill in the art fall within the scope of protection of the disclosure.

Figure 1:
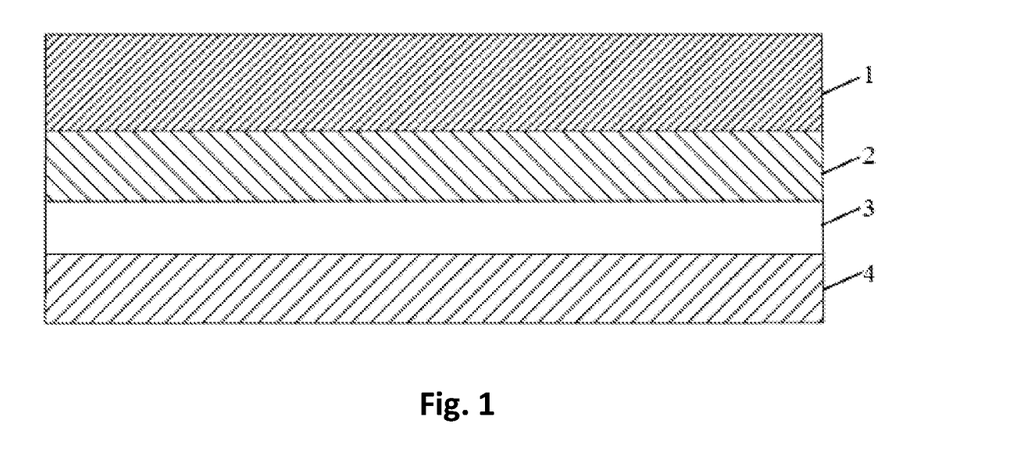
FIG. 1 is a schematic structural diagram of a carrier layer, a barrier layer, a striping layer, and a metal foil layer sequentially stacked in an embodiment of a metal foil with a carrier provided by the disclosure.

Referring to FIG. 1, a metal foil with a carrier according to a preferred embodiment of the disclosure includes a carrier layer 1, a barrier layer 2, a striping layer 3, and a metal foil layer 4.

Figure 4:
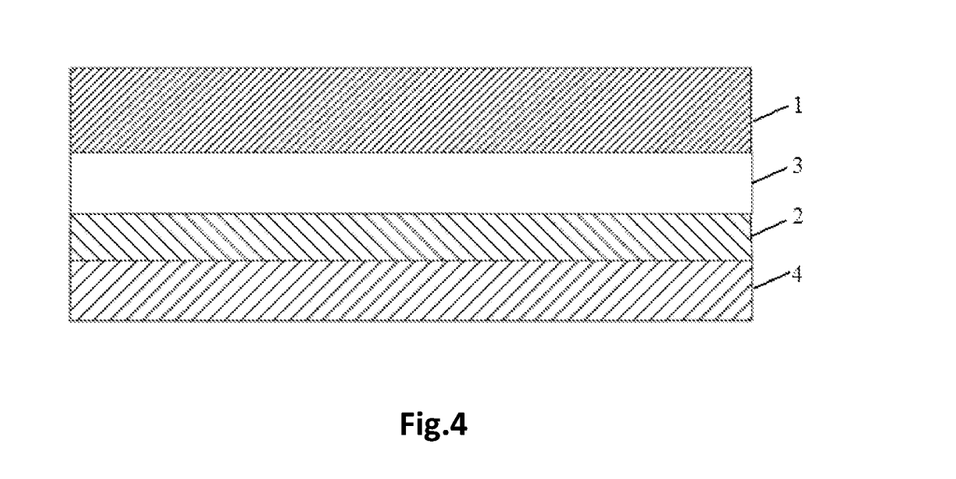
FIG. 4 is a schematic structural diagram of a carrier layer, a striping layer, a barrier layer, and a metal foil layer sequentially stacked in an embodiment of a metal foil with a carrier provided by the disclosure.

The carrier layer 1, the barrier layer 2, the striping layer 3, and the metal foil layer 4 are sequentially stacked; or, Referring to FIG. 4, the carrier layer 1, the striping layer 3, the barrier layer 2, and the metal foil layer 4 are sequentially stacked.

The diffusion depth of the carrier layer 1 to the metal foil layer 4 is less than or equal to 3 μm and the diffusion depth of the metal foil layer 4 toward the carrier layer 1 is less than or equal to 3 μm at a temperature of 20-400° C.

In the embodiments of the disclosure, the carrier layer 1, the barrier layer 2, the striping layer 3, and the metal foil layer 4 are sequentially stacked; or, the carrier layer 1, the striping layer 3, the barrier layer 2, and the metal foil layer 4 are sequentially stacked. The diffusion depth of the carrier layer 1 to the metal foil layer 4 is less than or equal to 3 μm and the diffusion depth of the metal foil layer 4 toward the carrier layer 1 is less than or equal to 3 μm at a temperature of 20-400° C. The carrier layer 1 is convenient to peel off by setting the striping layer 3, and the carrier layer 1 and the metal foil layer 4 are prevented from diffusing mutually to cause bonding at a high temperature by setting the barrier layer 2, so that the carrier layer 1 and the metal foil layer 4 are easy to peel off.

Preferably, the diffusion depth of the carrier layer 1 to the metal foil layer 4 is less than or equal to 1 μm and the diffusion depth of the metal foil layer 4 toward the carrier layer 1 is less than or equal to 1 μm.

Figure 10:
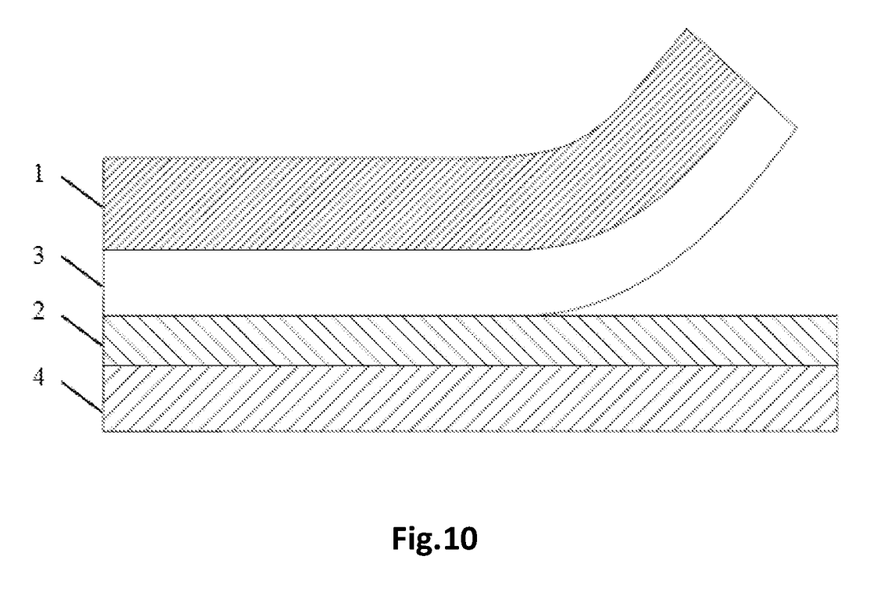
FIG. 10 is a schematic peeling diagram of a carrier layer, a striping layer, a barrier layer, and a metal foil layer sequentially stacked in another embodiment of a metal foil with a carrier provided by the disclosure.

As shown in FIG. 4 and FIG. 10, preferably, when the carrier layer 1, the striping layer 3, the barrier layer 2, and the metal foil layer 4 are sequentially stacked, the peel strength between the metal foil layer 4 and the barrier layer 2 is greater than the peel strength between the striping layer 3 and the barrier layer 2.

Figure 9:
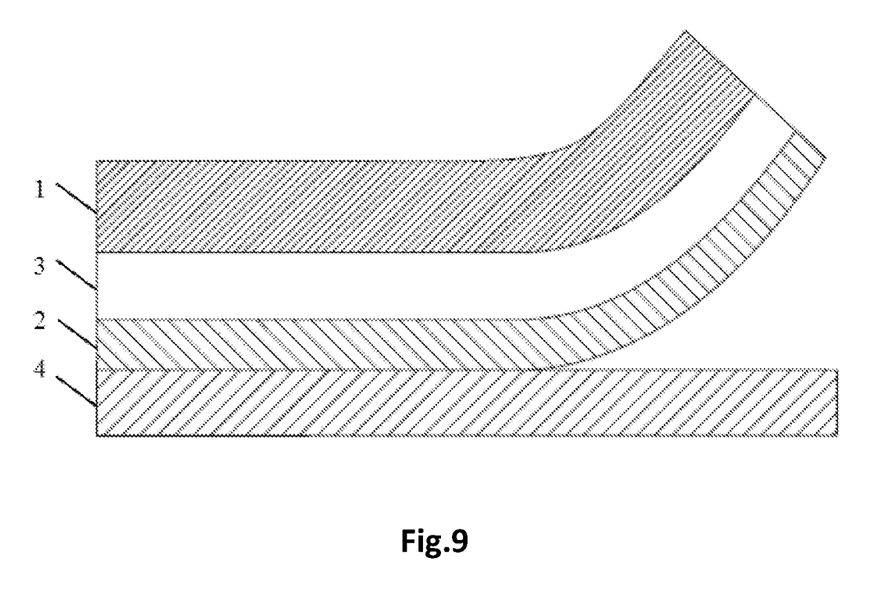
FIG. 9 is a schematic peeling diagram of a carrier layer, a striping layer, a barrier layer, and a metal foil layer sequentially stacked in an embodiment of a metal foil with a carrier provided by the disclosure.

When the carrier layer 1, the striping layer 3, the barrier layer 2, and the metal foil layer 4 are sequentially stacked, the peel strength between the metal foil layer 4 and the barrier layer 2 is greater than the peel strength between the striping layer 3 and the barrier layer 2. When the metal foil with a carrier is used, peeling occurs between the striping layer 3 and the barrier layer 2, and the barrier layer 2 can still remain on the metal foil layer 4. Therefore, the metal foil layer 4 can be prevented from being oxidized due to the barrier layer 2, thereby protecting the metal foil layer 4. Of course, the peel strength between the metal foil layer 4 and the barrier layer 2 may also be smaller than or equal to the peel strength between the striping layer 3 and the barrier layer 2, so that when the metal foil with a carrier is peeled off, the barrier layer 2 can partially or completely remain on the striping layer 3, and the carrier layer 1 and the striping layer 3 can be simultaneously peeled off from the metal foil layer 4. As shown in FIG. 4 and FIG. 9, detailed descriptions are omitted herein.

Figure 7:
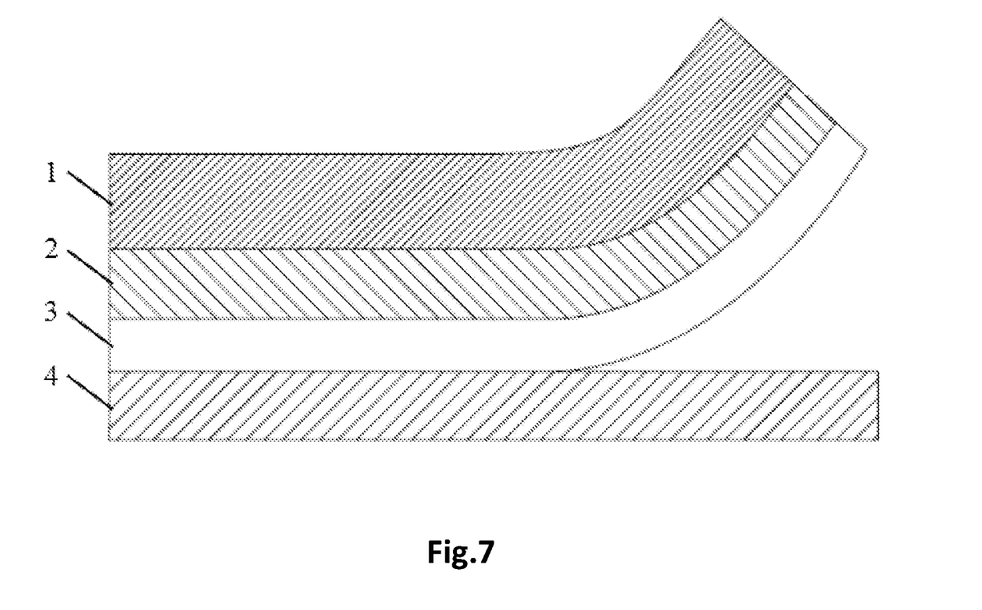
FIG. 7 is a schematic peeling diagram of a carrier layer, a barrier layer, a striping layer, and a metal foil layer sequentially stacked in an embodiment of a metal foil with a carrier provided by the disclosure.
Figure 8:
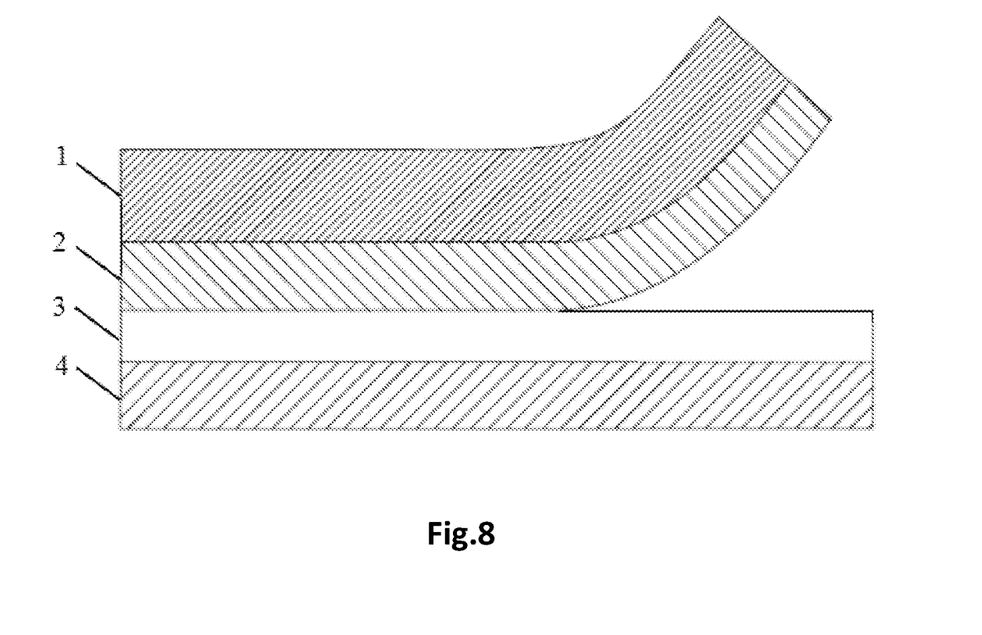
FIG. 8 is a schematic peeling diagram of a carrier layer, a barrier layer, a striping layer, and a metal foil layer sequentially stacked in another embodiment of a metal foil with a carrier provided by the disclosure.

As shown in FIG. 1 and FIG. 8, when the carrier layer 1, the barrier layer 2, the striping layer 3, and the metal foil layer 4 are sequentially stacked, the peel strength between the striping layer 3 and the metal foil layer 4 is greater than or equal to the peel strength between the striping layer 3 and the barrier layer 2. For this reason, when the metal foil with a carrier is peeled off, the striping layer 3 can partially or completely remain on the metal foil layer 4, so that the metal foil layer 4 can be prevented from being oxidized, and the metal foil layer 4 is further effectively protected. Of course, the peel strength between the striping layer 3 and the metal foil layer 4 may also be smaller than the peel strength between the striping layer 3 and the barrier layer 2, so that when the metal foil with a carrier is peeled off, the striping layer 3 can partially or completely remain on the barrier layer 2 and the carrier layer 1 and the barrier layer 2 can be simultaneously peeled off from the metal foil layer 4, As shown in FIG. 1 and FIG. 7, detailed descriptions are omitted herein.

As shown in FIG. 2, FIG. 3, FIG. 5 and FIG. 6, the barrier layer 2 includes a high-temperature resistant layer 21. The high-temperature resistant layer 21 is an organic high-temperature resistant layer, or the high-temperature resistant layer 21 is made of any one or more of tungsten, chromium, zirconium, titanium, nickel, molybdenum, cobalt, and graphite. Preferably, the high-temperature resistant layer 21 is a single-layer alloy structure or a multilayer structure formed by a single metal layer or a multilayer structure formed by an alloy layer and a single metal layer. Specifically, the single-layer alloy structure is a single-layer structure made of an alloy material, for example, a single-layer structure made of a tungsten-chromium alloy. The multilayer structure formed by the single metal layer is a multilayer structure formed by multiple single metal layers, for example, a multilayer structure formed by a tungsten metal layer and a chromium metal layer, each single-layer structure being made of one metal. The multilayer structure formed by the alloy layer and the single metal layer is a multilayer structure formed by multiple single-layer structures, for example, a multilayer structure formed by a zirconium metal layer and a tungsten-chromium alloy layer, each single-layer structure being formed by one metal or alloy material.

An organic high-temperature resistant material adopted by the organic high-temperature resistant layer is selected from a single material layer made of one or more of a nitrogen-containing organic compound, a sulfur-containing organic compound and a carboxylic acid, or is formed by multiple single material layers.

Figure 2:
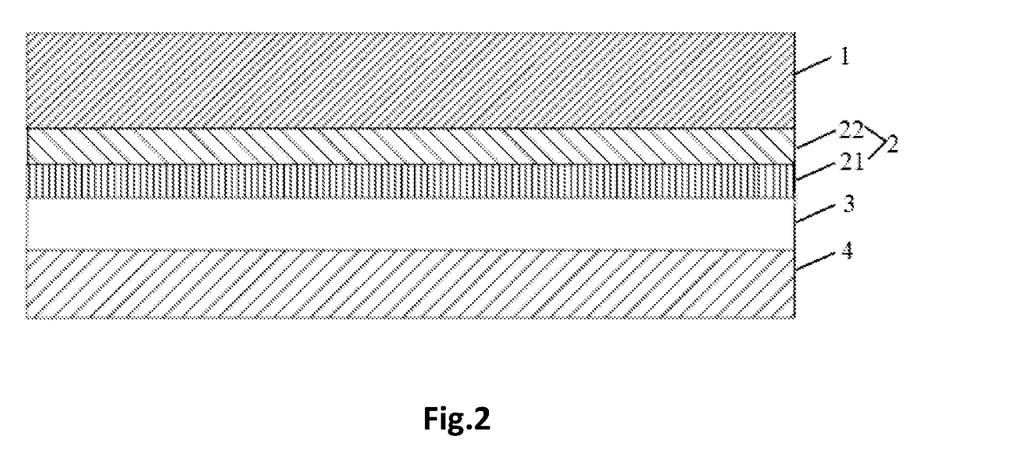
FIG. 2 is a schematic structural diagram of an embodiment of a metal foil with a carrier, provided by the disclosure, including a metal bonding layer and a high-temperature resistant layer, where a carrier layer, a barrier layer, a striping layer, and a metal foil layer sequentially stacked.
Figure 3:
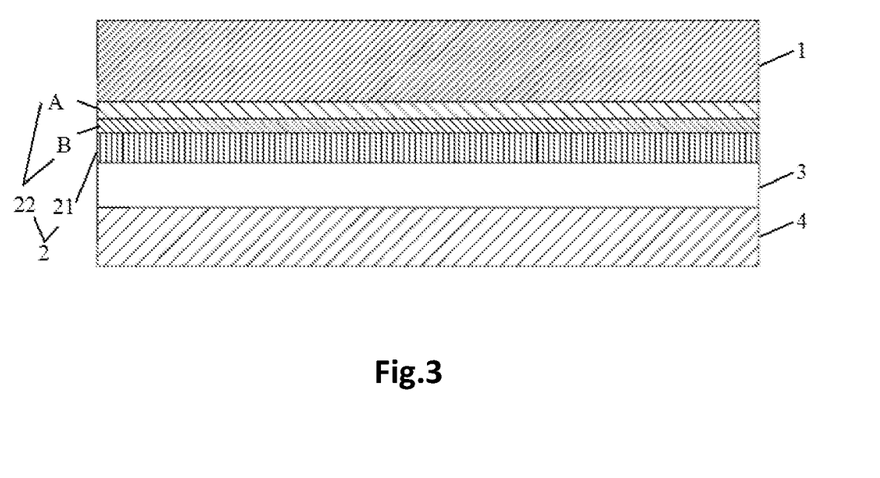
FIG. 3 is a schematic structural diagram of another embodiment of a metal foil with a carrier, provided by the disclosure, including a metal bonding layer and a high-temperature resistant layer, where a carrier layer, a barrier layer, a striping layer, and a metal foil layer sequentially stacked.

As shown in FIG. 2 and FIG. 3, when the carrier layer 1, the barrier layer 2, the striping layer 3, and the metal foil layer 4 are sequentially stacked, in order to prevent peeling delamination between the barrier layer 2 and the carrier layer 1, the barrier layer 2 in the present embodiment further includes a metal bonding layer 22, and the metal bonding layer 22 is disposed between the carrier layer 1 and the high-temperature resistant layer 21. For example, the barrier layer 2 includes metal A that may be bonded to the carrier layer 1 and/or metal B that is bonded to the high-temperature resistant layer 21, thereby it can prevent peeling between the carrier layer 1 and the barrier layer 2. For example, metal A is copper or zinc; metal B is nickel, iron or manganese. It can be understood that the metal bonding layer 22 is made of any one or more of copper, zinc, nickel, iron and manganese; or, the metal bonding layer 22 is made of one of copper or zinc and one of nickel, iron and manganese. The structure of the metal bonding layer 22 may include, but is not limited to, the following: (1) the metal bonding layer 22 is a single metal layer composed of metal A, metal A being copper or zinc; (2) the metal bonding layer 22 is a single metal layer composed of metal B, metal B being nickel or iron or manganese; (3) the metal bonding layer 22 is a single-layer alloy structure composed of metal A and metal B, for example, a single-layer alloy structure made of a copper-nickel alloy; (4) the metal bonding layer 22 includes a multilayer structure formed by an alloy layer and a single metal layer, for example, an alloy layer made of a copper-nickel alloy and a single metal layer made of manganese, the alloy layer of the metal bonding layer 22 being made of metal A and metal B, and the single metal layer of the metal bonding layer 22 being made of metal A or metal B; (5) the metal bonding layer 22 is a multilayer structure composed of a single-layer structure of metal A and a single-layer structure of metal B, for example, a multilayer structure formed by a copper metal layer and a nickel metal layer. When the metal bonding layer 22 is a multilayer structure composed of a single-layer structure of metal A and a single-layer structure of metal B, the single-layer structure of metal A is disposed between the carrier layer 1 and the single-layer structure of metal B. Since the bonding force between metal A and the carrier layer 1 is strong and the bonding force between metal B and the high-temperature resistant layer 21 is strong, the barrier layer 2 is not easily separated from the carrier layer 1 by setting the single-layer structure of metal A between the carrier layer 1 and the single-layer structure of metal B. By setting the metal bonding layer 22, the barrier layer 2 can be firmly connected to the carrier layer 1, thereby preventing peeling between the barrier layer 2 and the carrier layer 1. In addition, the thickness of the barrier layer 2 is greater than or equal to 10 Å. Preferably, the thickness of the barrier layer 2 is 10-500 Å.

In the present embodiment, the thickness of the metal foil layer 4 is less than or equal to 9 μm. In order to meet the requirements of fine circuit manufacturing of a circuit board, it is preferable that the metal foil layer 4 has a thickness of 6 μm, 5 μm, 4 μm, 2 μm, or the like, thereby obtaining an ultra-thin metal foil layer 4 favorable for forming a fine circuit board. In addition, in order to be able to peel off from the carrier layer 1 to obtain a complete ultra-thin metal foil layer 4 (particularly a metal foil layer having a thickness of 2 μm, 4 μm, or the like) with few pinholes, in the present embodiment, a metal bonding layer 22 is provided. By Setting the metal bonding layer 22, the peel strength between the barrier layer 2 and the carrier layer 1 is strong to effectively ensure that the carrier layer 1 can be stably peeled off from the metal foil layer 4, and further obtain a complete ultra-thin metal foil layer 4. The surface of the carrier layer 1 is treated by the metal bonding layer 22, so that the whole surface of the carrier layer 1 is more uniform and compact, the ultra-thin metal foil layer 4 with fewer pinholes can be conveniently peeled off from the carrier layer 1, and subsequent circuit manufacturing is facilitated. In addition, the metal foil layer 4 is a copper foil or an aluminum foil. The carrier layer 1 may be copper, aluminum or an organic thin film and the like. Since the carrier layer 1 mainly plays a bearing role, a certain thickness is required. When the carrier layer 1 is copper or aluminum, the thickness of the carrier layer 1 is preferably 9-50 μm; when the carrier layer 1 is an organic thin film, the thickness of the carrier layer 1 is preferably 20-100 μm.

Figure 5:
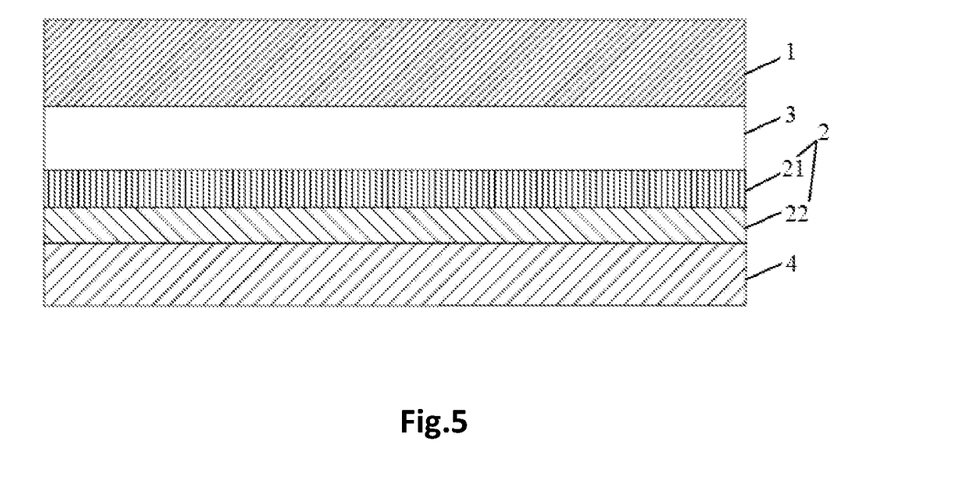
FIG. 5 is a schematic structural diagram of an embodiment of a metal foil with a carrier, provided by the disclosure, including a metal bonding layer and a high-temperature resistant layer, where a carrier layer, a striping layer, a barrier layer, and a metal foil layer sequentially stacked.
Figure 6:
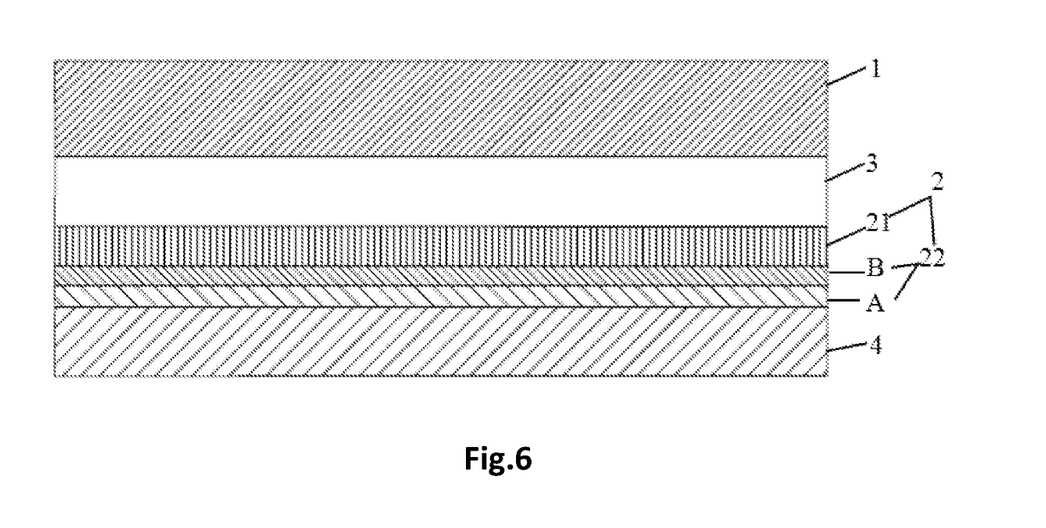
FIG. 6 is a schematic structural diagram of another embodiment of a metal foil with a carrier, provided by the disclosure, including a metal bonding layer and a high-temperature resistant layer, where a carrier layer, a barrier layer, a striping layer, and a metal foil layer sequentially stacked.

As shown in FIG. 5 and FIG. 6, similarly, with the carrier layer 1, the striping layer 3, the barrier layer 2, and the metal foil layer 4 sequentially stacked, when the metal foil with a carrier is peeled off, the barrier layer 2 remain on the metal foil layer 4, so as to prevent the metal foil layer 4 from oxidizing. The barrier layer 2 may further include a metal bonding layer 22, and the metal bonding layer 22 is disposed between the high-temperature resistant layer 4 and the metal foil layer 4. For example, the barrier layer 2 includes metal A that may be bonded to the metal foil layer 4 and/or metal B that is bonded to the high-temperature resistant layer 21, thereby preventing peeling between the metal foil layer 4 and the barrier layer 2. For example, metal A is copper or zinc; metal B is nickel, iron or manganese. It can be understood that the metal bonding layer 22 is made of any one or more of copper, zinc, nickel, iron and manganese; or, the metal bonding layer 22 is made of one of copper or zinc and one of nickel, iron and manganese. The structure of the metal bonding layer 22 may include, but is not limited to, the following: (1) the metal bonding layer 22 is a single metal layer composed of metal A, metal A being copper or zinc; (2) the metal bonding layer 22 is a single metal layer composed of metal B, metal B being nickel or iron or manganese; (3) the metal bonding layer 22 is a single-layer alloy structure composed of metal A and metal B, for example, a single-layer alloy structure made of a copper-nickel alloy; (4) the metal bonding layer 22 includes a multilayer structure formed by an alloy layer and a single metal layer, for example, an alloy layer made of a copper-nickel alloy and a single metal layer made of manganese, the alloy layer of the metal bonding layer 22 being made of metal A and metal B, and the single metal layer of the metal bonding layer 22 being made of metal A or metal B; (5) the metal bonding layer 22 is a multilayer structure composed of a single-layer structure of metal A and a single-layer structure of metal B, for example, a multilayer structure formed by a copper metal layer and a nickel metal layer. When the metal bonding layer 22 is a multilayer structure composed of a single-layer structure of metal A and a single-layer structure of metal B, the single-layer structure of metal A is disposed between the metal foil layer 4 and the single-layer structure of metal B. Since the bonding force between metal A and the metal foil layer 4 is strong and the bonding force between metal B and the high-temperature resistant layer 21 is strong, the barrier layer 2 is not easily separated from the metal foil layer 4 by setting the single-layer structure of metal A between the metal foil layer 4 and the single-layer structure of metal B. By setting the metal bonding layer 22, the barrier layer 2 can be firmly connected to the metal foil layer 4, thereby preventing peeling between the barrier layer 2 and the carrier layer 1. Therefore, when the metal foil with a carrier is peeled off, the barrier layer 2 can remain on the metal foil layer, so that the metal foil layer 4 is prevented from oxidizing, thereby protecting the metal foil layer 4. In addition, the thickness of the barrier layer 2 is greater than or equal to 10 Å. Preferably, the thickness of the barrier layer 2 is 10-500 Å.

In the embodiments of the disclosure, the striping layer 3 is made of any one or more of nickel, silicon, molybdenum, graphite, titanium, and niobium; or, the striping layer 3 is made of an organic polymer material. The thickness of the striping layer 3 is preferably 10-500 Å. Since a uniform metal foil layer 4 is difficult to form when the striping layer 3 is too thick, a large number of pinholes are easily generated in the metal foil layer 4. When the metal foil layer 4 is provided with pinholes, an open circuit phenomenon is easily generated after the metal foil layer is etched into a circuit. When the striping layer 3 is too thin, it is easy to cause difficulty in peeling between the striping layer 3 and the metal foil layer 4. Therefore, the thickness of the striping layer 3 is preferably 10-500 Å, so that it is ensured that a uniform metal foil layer 4 can be formed, and the generation of a large number of pinholes in the metal foil layer 4 is avoided, while allowing peeling between the striping layer 3 and the metal foil layer 4.

In the embodiments of the disclosure, the roughness Rz of a face of the carrier layer 1 close to the metal foil layer 4 is less than or equal to 5 μm; and/or the roughness Rz of a face of the metal foil layer 4 away from the carrier layer 1 is less than or equal to 3.0 μm. When the metal foil layer 4 is a copper foil, the roughness of the copper foil is larger, the bonding force between the copper foil and other materials is larger. But when the roughness of the copper foil is too large, the copper foil cannot be applied to a circuit board for high-frequency signal transmission. For the reason, the roughness Rz of a common copper foil is 0.5-3.0 μm. When the copper foil is applied at a high frequency, the roughness of the copper foil is set to be less than 0.5 μm, so that the copper foil can be applied to a circuit board for high-frequency signal transmission on the premise of ensuring the adhesive force between the copper foil and other materials.

In the embodiments of the disclosure, it is to be noted that the roughness Rz represents the maximum height of a contour: distance between a crest line and a valley line of the contour. The sampling length is the length of a reference line specified for evaluating the surface roughness, the sampling length should adopt the length which can reflect the surface roughness features according to the formation condition and the texture features of actual surfaces of parts, and the sampling length should be measured according to the total trend of an actual surface contour.

In the embodiments of the disclosure, in order to prevent the carrier layer 1 from oxidizing, a first anti-oxidation layer is disposed on a side of the carrier layer 1 close to the barrier layer 2. By setting the first anti-oxidation layer to prevent the carrier layer 1 from oxidizing, the carrier layer 1 is protected. In order to prevent the metal foil layer 4 from oxidizing, a second anti-oxidation layer is disposed on a side of the metal foil layer 4 away from the barrier layer 2. By setting the second anti-oxidation layer to prevent the metal foil layer 4 from oxidizing, the metal foil layer 4 is protected.

Figure 11:
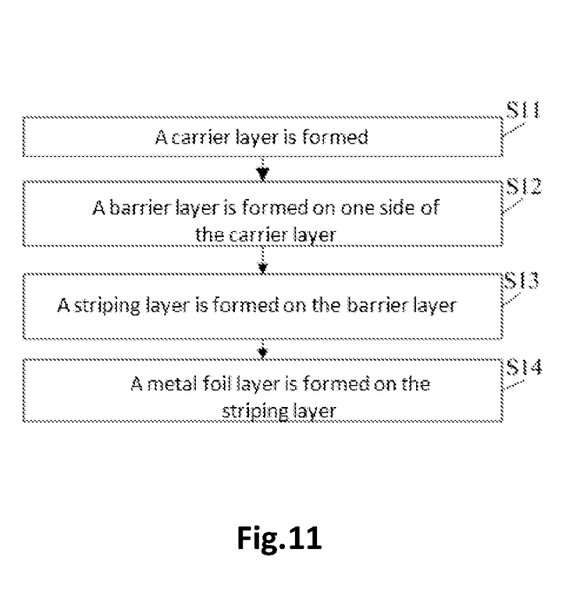
FIG. 11 is a schematic flow diagram of an embodiment of a preparation method of a metal foil with a carrier provided by the disclosure.
Figure 12:
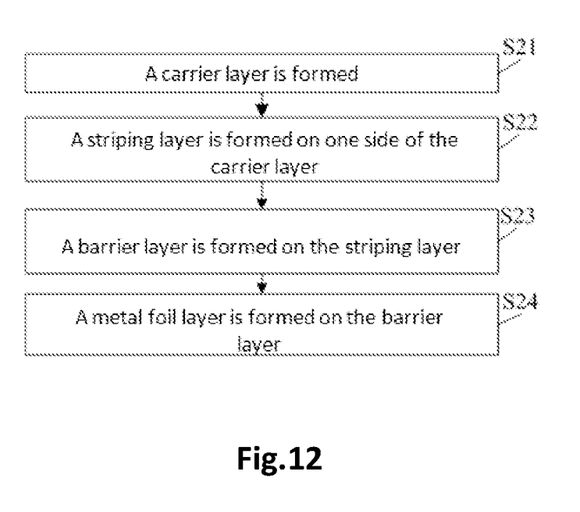
FIG. 12 is a schematic flow diagram of another embodiment of a preparation method of a metal foil with a carrier provided by the disclosure.

As shown in FIG. 11 and FIG. 12, in order to solve the same technical problem, the embodiments of the disclosure also provide a preparation method for preparing the metal foil with a carrier, which includes the following steps:

In S11, a carrier layer 1 is formed;

In S12, a barrier layer 2 is formed on one side of the carrier layer 1;

In S13, a striping layer 3 is formed on the barrier layer 2;

In S14, a metal foil layer 4 is formed on the striping layer 3.

Or,

In S21, a carrier layer 1 is formed;

In S22, a striping layer 3 is formed on one side of the carrier layer 1;

In S23, a barrier layer 2 is formed on the striping layer 3;

In S24, a metal foil layer 4 is formed on the barrier layer 2.

The diffusion depth of the carrier layer 1 to the metal foil layer 4 is less than or equal to 3 μm and the diffusion depth of the metal foil layer 4 toward the carrier layer 1 is less than or equal to 3 μm at a temperature of 20-400° C.

Preferably, the diffusion depth of the carrier layer 1 to the metal foil layer 4 is less than or equal to 1 μm and the diffusion depth of the metal foil layer 4 toward the carrier layer 1 is less than or equal to 1 μm.

As shown in FIG. 4 and FIG. 10, preferably, when the carrier layer 1, the striping layer 3, the barrier layer 2, and the metal foil layer 4 are sequentially stacked, the peel strength between the metal foil layer 4 and the barrier layer 2 is greater than the peel strength between the striping layer 3 and the barrier layer 2. When the carrier layer 1, the striping layer 3, the barrier layer 2, and the metal foil layer 4 are sequentially stacked, the peel strength between the metal foil layer 4 and the barrier layer 2 is greater than the peel strength between the striping layer 3 and the barrier layer 2. For this reason, when the metal foil with a carrier is used, peeling occurs between the striping layer 3 and the barrier layer 2, and the barrier layer 2 can still remain on the metal foil layer 4. Therefore, the metal foil layer 4 can be prevented from being oxidized due to the barrier layer 2, thereby protecting the metal foil layer 4. Of course, the peel strength between the metal foil layer 4 and the barrier layer 2 may also be smaller than or equal to the peel strength between the striping layer 3 and the barrier layer 2, so that when the metal foil with a carrier is peeled off, the barrier layer 2 can partially or completely remain on the striping layer 3 and be simultaneously peeled off from the metal foil layer 4 with the carrier layer 1 and the striping layer 3, as shown in FIG. 4 and FIG. 9, detailed descriptions are omitted herein.

In the embodiments of the disclosure, the operation that the barrier layer 2 is formed on one side of the carrier layer 1 specifically includes the following steps:

In S131, a metal bonding layer 22 is formed on one side of the carrier layer 1:

In S132, a high-temperature resistant layer 21 is formed on the metal bonding layer 22.

In the embodiments of the disclosure, the operation that the barrier layer 2 is formed on the striping layer 3 specifically includes the following steps:

In S231, a high-temperature resistant layer 21 is formed on the striping layer 3;

In S232, a metal bonding layer 22 is formed on the high-temperature resistant layer 21.

In the embodiments of the disclosure, the metal bonding layer 22 and the high-temperature resistant layer 21 may be formed by sputtering, the current in the sputtering manner is preferably 6-12 A, and the voltage is preferably 300-500V. The metal bonding layer 22 may be made of any one or more of copper, zinc, nickel, iron and manganese; or, the metal bonding layer 22 is made of one of copper or zinc and one of nickel, iron and manganese. The high-temperature resistant layer 21 may be an organic high-temperature resistant layer; or, the high-temperature resistant layer 21 may be made of any one or more of tungsten, chromium, zirconium, titanium, nickel, molybdenum, cobalt and graphite, and the high-temperature resistant layer 21 may be a single-layer alloy structure or a multilayer structure formed by a single metal layer or a multilayer structure formed by an alloy layer and a single metal layer.

In the embodiments of the disclosure, the operation that the carrier layer 1 is formed specifically includes the following steps:

In S111, a first metal layer is generated by first electroplating;

In S112, the surface of the first metal layer is subjected to second electroplating to generate a second metal layer, the first metal layer and the second metal layer forming a carrier layer.

In the embodiments of the disclosure, the method further includes the following steps after the carrier layer 1 is formed:

In S113, the carrier layer 1 is roughened to obtain a roughened carrier layer 1;

In S114, a first anti-oxidation layer is formed on the roughened carrier 1.

The carrier layer 1 may be copper or aluminum, when the carrier layer 1 is copper, the first metal layer and the second metal layer are both copper metal layers, and when the carrier layer 1 is aluminum, the first metal layer and the second metal layer are both aluminum metal layers. A plating solution for the first electroplating may include a copper sulfate solution. The plating solution for the first electroplating has a copper content of 15-25 g/L and a pH value of 6-9. A plating solution for the second electroplating may include a copper sulfate solution. The plating solution for the second electroplating has a copper content of 70-80 g/L and an acid content of 90-100 g/L. The plating solution for the second electroplating further comprises an additive that includes a brightener sodium sulfonate, a leveler thiourea and a wetting agent polyethylene glycol, the mass concentration of the brightener sodium sulfonate is preferably 0.1-2 g/L, the mass concentration of the leveler thiourea is preferably 0.01-1 g/L, and the mass concentration of the wetting agent polyethylene glycol is preferably 0.1-5 g/L. The carrier layer 1 may be roughened by acidic electroplating. A plating solution for acidic copper plating may include a copper sulfate solution. The plating solution for acidic copper plating has a copper content of 10-15 g/L, an acid content of 90-100 g/L and a molybdenum content of 600-800 PPM. The first anti-oxidation layer may be formed in the form of galvanizing a zinc-nickel alloy. In addition, after the first anti-oxidation layer is formed on the roughened carrier layer 1, the first anti-oxidation layer may be subjected to plasma cleaning. The voltage for plasma cleaning is preferably 1500-2500V, and the current is preferably 0.1-1.5 A.

In the embodiments of the disclosure, in order to further prevent bonding between the carrier layer 1 and the metal foil layer 4, the method further includes the following step after the carrier layer 1 is formed in the present embodiment:

In S115, the carrier layer is annealed under heat treatment conditions, the heat treatment conditions including a heat treatment temperature of 200-300° C. and a heating time of 30-300 minutes. Preferably, the heating time is 1 hour. The carrier layer 1 is annealed under the heat treatment conditions so as to inhibit crystal growth of the carrier layer 1 in the heating process, thereby delaying diffusion of the carrier layer 1 in the heating process, and further preventing bonding between the carrier layer 1 and the metal foil layer 4.

In the embodiments of the disclosure, the striping layer 3 may be made of any one or more of nickel, silicon, molybdenum, graphite, titanium, and niobium. In addition, forming the striping layer 3 on the barrier layer 2 or forming the striping layer 3 on one side of the carrier layer 1 may be performed in a sputtering manner specifically. Sputtering conditions for forming the striping layer 3 in the sputtering manner may include: the current is preferably 6-12 A, and the voltage is preferably 300-500V.

Due to the fact that the electroplating mode is adopted, the roughness of the barrier layer 2 and the striping layer 3 is easily influenced by current during electroplating, so that the surface roughness of the barrier layer 2 and the striping layer 3 which are formed is very non-uniform. The surface roughness of the metal foil layer 4 which is formed subsequently is also non-uniform, the good peel stability and the number of pinholes which are formed are not facilitated subsequently, and subsequent circuit manufacturing is also not facilitated. Based on this, in the embodiments of the disclosure, the metal bonding layer 22, the high-temperature resistant layer 21 and the striping layer 3 are preferably performed by sputtering, the current in the sputtering manner is preferably 6-12 A, and the voltage is preferably 300-500V. The metal bonding layer 22 and the high-temperature resistant layer 21 formed by sputtering form the barrier layer 2, so as to ensure that the uniform and compact barrier layer 2 is obtained, and the uniform and compact striping layer 3 is formed by sputtering. Thereby it is beneficial to improving the peel stability of the metal foil with a carrier and effectively reducing the number of pinholes. In addition, the metal foil layer 4 is preferably formed by electroplating, before the metal foil layer 4 is formed, the uniform and compact barrier layer 2 and striping layer 3 are formed by sputtering, uniform electroplating of the metal foil layer 4 is facilitated, the surface roughness of the formed metal foil layer 4 is uniform, subsequent circuit manufacturing is facilitated, and the manufacturing of a thinner metal foil layer 4 is facilitated.

In the embodiments of the disclosure, the operation that the metal foil layer 4 is formed on the striping layer 3 specifically includes the following steps:

In S141, a third metal layer is sputtered on the striping layer 3;

In S142, a fourth metal layer is electroplated on the sputtered third metal layer, the third metal layer and the fourth metal layer forming the metal foil layer; Or, the operation that the metal foil layer 4 is formed on the barrier layer 2 specifically includes the following step:

In S241, a third metal layer is sputtered on the barrier layer 2;

In S242, a fourth metal layer is electroplated on the sputtered third metal layer, the third metal layer and the fourth metal layer forming the metal foil layer.

The metal foil layer 4 may be a copper foil or an aluminum foil, when the metal foil layer 4 is a copper foil, the third metal layer and the fourth metal layer are both copper metal layers, and when the metal foil layer 4 is an aluminum foil, the third metal layer and the fourth metal layer are both aluminum metal layers. Since the striping layer 3 has a peel property, if only an electroplating mode is adopted, the electroplated metal layer is prone to be non-uniform. And in order to obtain the metal foil layer 4 with a uniform surface, the third metal layer is sputtered firstly and then the fourth metal layer is electroplated in the present embodiment, so that the metal foil layer 4 is prevented from generating pinholes, and then the metal foil layer 4 with the uniform surface is obtained. The sputtering conditions for sputtering the third metal layer on the striping layer 3 or the barrier layer 2 include: the current is preferably 6-12 A, the voltage is preferably 300-500V, the vacuum degree is preferably 0.1-0.5 Pa, the sputtering speed is preferably 4-10 m/min, and the winding and unwinding tension is preferably 60-150 N.

In the embodiments of the disclosure, the step that the fourth metal layer is electroplated on the sputtered third metal layer specifically includes the following steps:

In S31, a fifth metal layer is generated by a third electroplating;

In S32, the surface of the fifth metal layer is subjected to a fourth electroplating to generate a sixth metal layer, the fifth metal layer and the sixth metal layer forming the fourth metal layer.

A plating solution for the third electroplating may include a copper sulfate solution. The plating solution for the third electroplating has a copper content of 15-25 g/L and a pH value of 6-9. A plating solution for the fourth electroplating may include a copper sulfate solution. The plating solution for the fourth electroplating has a copper content of 70-80 g/L and an acid content of 90-100 g/L. The plating solution for the fourth electroplating includes an additive that includes a brightener sodium sulfonate, a leveler thiourea and a wetting agent polyethylene glycol. The mass concentration of the brightener sodium sulfonate is preferably 0.1-2 g/L, the mass concentration of the leveler thiourea is preferably 0.01-1 g/L, and the mass concentration of the wetting agent polyethylene glycol is preferably 0.1-5 g/L. The metal foil layer 4 may be a copper foil or an aluminum foil. When the metal foil layer 4 is a copper foil, the fifth metal layer and the sixth metal layer are both copper metal layers. When the metal foil layer 4 is an aluminum foil, the fifth metal layer and the sixth metal layer are both aluminum metal layers. In the embodiments of the disclosure, in order to avoid the warpage of the metal foil with a carrier, the plating solutions (including the plating solution for the first electroplating, the plating solution for the second electroplating, the plating solution for the third electroplating and the plating solution for the fourth electroplating) for preparing the carrier layer 1 and the metal foil layer 4 are the same in the present embodiment, so that the stress effect and the tension effect of the carrier layer 1 and the metal foil layer 4 are the same, the bending degrees of the carrier layer 1 and the metal foil layer 4 are the same, and the warpage of the metal foil with a carrier is further avoided.

In the embodiments of the disclosure, the preparation method of the metal foil with a carrier further includes the following steps:

In S41, a face of the metal foil layer 4 away from the carrier layer 1 is roughened;

In S42, a second anti-oxidation layer is formed on the roughened face of the metal foil layer 4 away from the carrier layer 1.

The face of the metal foil layer 4 away from the carrier layer 1 may be roughened by means of acidic electroplating. A plating solution for acidic copper plating has a copper content of 10-15 g/L, an acid content of 90-100 g/L and a molybdenum content of 600-800 PPM. The second anti-oxidation layer may be formed in the form of galvanizing a zinc-nickel alloy. In addition, after the second anti-oxidation layer is formed, the second anti-oxidation layer may be subjected to plasma cleaning. The voltage for plasma cleaning is preferably 1500-2500V, and the current is preferably 0.1-1.5 A.

The following embodiments are provided to illustrate the preparation method of the metal foil with a carrier, specifically as follows.

EMBODIMENTS

Embodiment 1

In S51, a carrier layer 1 is formed. Specifically, a first metal layer is generated by first electroplating firstly, and then the surface of the first metal layer is subjected to second electroplating to generate a second metal layer, the first metal layer and the second metal layer forming a carrier layer. Then, the carrier layer 1 is roughened, and a first anti-oxidation layer is formed on the roughened carrier layer 1. The carrier layer 1 is annealed under heat treatment conditions, the heat treatment conditions including a heat treatment temperature of 250° C. and a heating time of 1 hour. The carrier layer 1 is copper. A plating solution for the first electroplating includes a copper sulfate solution. The plating solution for the first electroplating has a copper content of 20 g/L and a pH value of 7. A plating solution for the second electroplating may include a copper sulfate solution. The plating solution for the second electroplating has a copper content of 75 g/L and an acid content of 95 g/L. The plating solution for the second electroplating further includes an additive that includes a brightener sodium sulfonate, a leveler thiourea and a wetting agent polyethylene glycol. The mass concentration of the brightener sodium sulfonate is 0.8 g/L, the mass concentration of the leveler thiourea is 0.5 g/L, and the mass concentration of the wetting agent polyethylene glycol is 3 g/L. In addition, the carrier layer 1 is roughened by means of acidic electroplating. A plating solution for acidic copper plating includes a copper sulfate solution, and the plating solution for acidic copper plating has a copper content of 13 g/L, an acid content of 95 g/L and a molybdenum content of 700 PPM. The first anti-oxidation layer is formed in the form of galvanizing a nickel alloy.

In S52, a barrier layer 2 is formed on one side of the carrier layer 1 by sputtering. Specifically, a metal bonding layer 22 is formed on one side of the carrier layer 1 by sputtering firstly, and then a high-temperature resistant layer 21 is formed on the metal bonding layer 22 by sputtering. The metal bonding layer 22 is a structure formed by a copper metal layer and a nickel metal layer, the copper metal layer is connected to the carrier layer 1, and the nickel metal layer is connected to the high-temperature resistant layer 21. The high-temperature resistant layer 21 is a single-layer alloy structure made of a tungsten-titanium alloy.

In S53, a striping layer 3 is formed on the barrier layer 2 by sputtering, the striping layer 3 being a graphite layer.

In S54, a metal foil layer 4 is formed on the striping layer 3. Specifically, a third metal layer is sputtered on the striping layer 3 firstly, and then a fourth metal layer is electroplated on the third metal layer, the third metal layer and the fourth metal layer forming the metal foil layer. The metal foil layer 4 is a copper foil, and the third metal layer and the fourth metal layer are both copper metal layers. The sputtering conditions for sputtering the third metal layer on the striping layer 3 include: the current is preferably 9 A, the voltage is preferably 400V, the vacuum degree is preferably 0.3 Pa, the sputtering speed is preferably 7 m/min, and the winding and unwinding tension is preferably 100 N. The plating solutions (including the plating solution for the first electroplating, the plating solution for the second electroplating, the plating solution for the third electroplating and the plating solution for the fourth electroplating) for preparing the carrier layer 1 and the metal foil layer 4 are the same in the present embodiment.

In S55, a face of the metal foil layer 4 away from the carrier layer 1 is roughened, and a second anti-oxidation layer is formed on the roughened face of the metal foil layer 4 away from the carrier layer 1 in an acid electroplating mode. The plating solution for acidic copper plating has a copper content of 13 g/L, an acid content of 95 g/L and a molybdenum content of 600-800 PPM. In addition, the second anti-oxidation layer is formed in the form of galvanizing a zinc-nickel alloy.

Embodiment 2

The present embodiment differs from Embodiment 1 in that the high-temperature resistant layer 21 is a single-layer alloy structure made of a tungsten-nickel alloy. The other processes and steps of the present embodiment are the same as those of Embodiment 1 and will not be described in further detail herein.

Embodiment 3

The present embodiment differs from Embodiment 1 in that the high-temperature resistant layer 21 is a single-layer alloy structure made of a tungsten-molybdenum alloy. The other processes and steps of the present embodiment are the same as those of Embodiment 1 and will not be described in further detail herein.

Embodiment 4

The present embodiment differs from Embodiment 1 in that the high-temperature resistant layer 21 is a single-layer alloy structure made of a chromium-nickel alloy. The other processes and steps of the present embodiment are the same as those of Embodiment 1 and will not be described in further detail herein.

Embodiment 5

The present embodiment differs from Embodiment 1 in that the high-temperature resistant layer 21 is a single-layer alloy structure made of a zirconium-titanium alloy. The other processes and steps of the present embodiment are the same as those of Embodiment 1 and will not be described in further detail herein.

Embodiment 6

The present embodiment differs from Embodiment 1 in that the high-temperature resistant layer 21 is a single-layer alloy structure made of a titanium-nickel alloy. The other processes and steps of the present embodiment are the same as those of Embodiment 1 and will not be described in further detail herein.

Embodiment 7

The present embodiment differs from Embodiment 1 in that the high-temperature resistant layer 21 is a single-layer alloy structure made of a titanium-molybdenum alloy. The other processes and steps of the present embodiment are the same as those of Embodiment 1 and will not be described in further detail herein.

Embodiment 8

The present embodiment differs from Embodiment 1 in that the high-temperature resistant layer 21 is a single-layer alloy structure made of a titanium-cobalt alloy. The other processes and steps of the present embodiment are the same as those of Embodiment 1 and will not be described in further detail herein.

Embodiment 9

The present embodiment differs from Embodiment 1 in that the high-temperature resistant layer 21 is a single-layer alloy structure made of a nickel-molybdenum alloy. The other processes and steps of the present embodiment are the same as those of Embodiment 1 and will not be described in further detail herein.

Embodiment 10

The present embodiment differs from Embodiment 1 in that the high-temperature resistant layer 21 is a single-layer alloy structure made of a molybdenum-cobalt alloy. The other processes and steps of the present embodiment are the same as those of Embodiment 1 and will not be described in further detail herein.

Embodiment 11

The present embodiment differs from Embodiment 1 in that the high-temperature resistant layer 21 is a structure made of a tungsten metal layer and a graphite layer, the tungsten metal layer is connected to the metal bonding layer 22, and the graphite layer is connected to the striping layer 3. The other processes and steps of the present embodiment are the same as those of Embodiment 1 and will not be described in further detail herein.

Embodiment 12

The present embodiment differs from Embodiment 1 in that the high-temperature resistant layer 21 is a structure made of a chromium metal layer and a graphite layer, the chromium metal layer is connected to the metal bonding layer 22, and the graphite layer is connected to the striping layer 3. The other processes and steps of the present embodiment are the same as those of Embodiment 1 and will not be described in further detail herein.

Embodiment 13

The present embodiment differs from Embodiment 1 in that the high-temperature resistant layer 21 is a structure made of a nickel metal layer and a graphite layer, the nickel metal layer is connected to the metal bonding layer 22, and the graphite layer is connected to the striping layer 3. The other processes and steps of the present embodiment are the same as those of Embodiment 1 and will not be described in further detail herein.

Embodiment 14

The present embodiment differs from Embodiment 1 in that the high-temperature resistant layer 21 is a structure made of a tungsten-nickel alloy and a chromium metal layer, the tungsten-nickel alloy is connected to the metal bonding layer 22, and the chromium metal layer is connected to the striping layer 3. The other processes and steps of the present embodiment are the same as those of Embodiment 1 and will not be described in further detail herein.

Embodiment 15

The present embodiment differs from Embodiment 1 in that the high-temperature resistant layer 21 is a structure made of a nickel-molybdenum alloy and a chromium metal layer, the nickel-molybdenum alloy is connected to the metal bonding layer 22, and the chromium metal layer is connected to the striping layer 3. The other processes and steps of the present embodiment are the same as those of Embodiment 1 and will not be described in further detail herein.

Embodiment 16

The present embodiment differs from Embodiment 1 in that the high-temperature resistant layer 21 is a structure made of a molybdenum-cobalt alloy and a chromium metal layer, the molybdenum-cobalt alloy is connected to the metal bonding layer 22, and the chromium metal layer is connected to the striping layer 3. The other processes and steps of the present embodiment are the same as those of Embodiment 1 and will not be described in further detail herein.

Embodiment 17

The present embodiment differs from Embodiment 1 in that the high-temperature resistant layer 21 is a structure made of a titanium-nickel alloy and a chromium metal layer, the titanium-nickel alloy is connected to the metal bonding layer 22, and the chromium metal layer is connected to the striping layer 3. The other processes and steps of the present embodiment are the same as those of Embodiment 1 and will not be described in further detail herein.

Embodiment 18

In S51, a carrier layer 1 is formed. Specifically, a first metal layer (having a thickness of 1 µm) is generated by first electroplating firstly, and then the surface of the first metal layer is subjected to second electroplating to generate a second metal layer (a thickness of 35 µm), the first metal layer and the second metal layer forming a carrier layer. Then, the carrier layer 1 is roughened, and a first anti-oxidation layer is formed on the roughened carrier layer 1. The carrier layer 1 is annealed under heat treatment conditions, the heat treatment conditions including a heat treatment temperature of 250° C. and a heating time of 1 hour. The carrier layer 1 is copper, the plating solutions for the first electroplating process and the second electroplating process include a copper sulfate solution, sodium sulfonate, thiourea and polyethylene glycol. The copper solution has a copper content of 75 g/L and an acid content of 95 g/L, the mass concentration of the sodium sulfonate is 0.8 g/L, the mass concentration of the thiourea is 0.5 g/L, and the mass concentration of the polyethylene glycol is 3 g/L. In addition, the carrier layer 1 is roughened by means of acidic electroplating. A plating solution for acidic copper plating includes a copper sulfate solution, and the plating solution for acidic copper plating has a copper content of 13 g/L, an acid content of 95 g/L and a molybdenum content of 700 PPM. The first anti-oxidation layer is formed in the form of galvanizing a nickel alloy.

In S52, a barrier layer 2 is formed on one side of the carrier layer 1 by sputtering specifically as follows:

A metal bonding layer 22 (a thickness of 60 Å) is formed on one side of the carrier layer 1 by sputtering firstly, and then a high-temperature resistant layer 21 (a thickness of 200 Å) is formed on the metal bonding layer 22 by sputtering. The metal bonding layer 22 is a structure formed by a copper metal layer and a nickel metal layer, the copper metal layer is connected to the carrier layer 1, and the nickel metal layer is connected to the high-temperature resistant layer 21. The high-temperature resistant layer 21 is a single-layer alloy structure made of a tungsten-titanium alloy.

In S53, a striping layer 3 is formed on the barrier layer 2 by sputtering, the striping layer 3 being a graphite layer.

In S54, a metal foil layer 4 is formed on the striping layer 3 specifically as follows.

A third metal layer (a thickness of 200 Å) is sputtered on the striping layer 3 firstly, and then a fourth metal layer (a thickness of 4 µm) is formed on the third metal layer through a third electroplating process, the third metal layer and the fourth metal layer forming the metal foil layer. The metal foil layer 4 is a copper foil, and the third metal layer and the fourth metal layer are both copper metal layers. The sputtering conditions for sputtering the third metal layer on the striping layer 3 include: the current is 9 A, the voltage is 400V, the vacuum degree is 0.3 Pa, the sputtering speed is 7 m/min, and the winding and unwinding tension is 100 N. The plating solutions (including the plating solution for the first electroplating, the plating solution for the second electroplating and the plating solution for the third electroplating) for preparing the carrier layer 1 and the metal foil layer 4 are the same in the present embodiment.

In S55, a face of the metal foil layer 4 away from the carrier layer 1 is roughened, and a second anti-oxidation layer is formed on the roughened face of the metal foil layer 4 away from the carrier layer 1 in an acid electroplating mode, the plating solution for acidic copper plating having a copper content of 13 g/L, an acid content of 95 g/L and a molybdenum content of 700 PPM. In addition, the second anti-oxidation layer is formed in the form of galvanizing a zinc-nickel alloy.

Embodiment 19

The present embodiment differs from Embodiment 18 in that the metal bonding layer 22 is a copper metal layer. The other processes and steps of the present embodiment are the same as those of Embodiment 1 and will not be described in further detail herein.

Embodiment 20

The present embodiment differs from Embodiment 18 in that the plating solutions for forming the carrier layer 1 and the metal foil layer 4 are different, specifically as follows.

The plating solution for forming the carrier layer 1 has a copper content of 20 g/L and a pH value of 7. An additive includes a brightener sodium sulfonate, a leveler thiourea and a wetting agent polyethylene glycol, while the mass concentration of the brightener sodium sulfonate is 0.8 g/L, the mass concentration of the leveler thiourea is 0.5 g/L, and the mass concentration of the wetting agent polyethylene glycol is 3 g/L.

The plating solution for forming the metal foil layer 4 has a copper content of 10 g/L and a pH value of 9. An additive includes a brightener sodium sulfonate, a leveler thiourea and a wetting agent polyethylene glycol, the mass concentration of the brightener sodium sulfonate is 2 g/L, the mass concentration of the leveler thiourea is 1.5 g/L, and the mass concentration of the wetting agent polyethylene glycol is 3 g/L.

Embodiment 21

The present embodiment differs from Embodiment 18 in that an annealing treatment temperature is 150° C., and a heating time is 120 minutes.

Comparative Example 1

The present embodiment differs from Embodiment 1 in that after forming the carrier layer 1, the barrier layer 2 is not made, but the striping layer 3 is formed directly on the carrier layer 1. The other processes and steps of the present embodiment are the same as those of Embodiment 1 and will not be described in further detail herein.

Comparative Example 2

The present embodiment differs from Embodiment 1 in that after forming the metal bonding layer 22, the high-temperature resistant layer 21 is not made, but the striping layer 3 is formed directly on the metal bonding layer 22. The other processes and steps of the present embodiment are the same as those of Embodiment 1 and will not be described in further detail herein.

Comparative Example 3

The present embodiment differs from Embodiment 1 in that after forming the carrier layer 1, the metal bonding layer 22 is not made, but the high-temperature resistant layer 21 is formed directly on the carrier layer 1. The other processes and steps of the present embodiment are the same as those of Embodiment 1 and will not be described in further detail herein.

Table 1 is a test result that the metal foils with a carrier prepared in Embodiments 1 to 21 were directly subjected to a plurality of tests at a normal temperature (for example, 16 to 27° C., taking 25° C. as an example), or were subjected to a plurality of tests at different temperatures (200° C. and 340° C.) after being laminated with a flexible insulating base film, respectively, including the tested diffusion depth of the carrier layer 1 to the metal foil layer 4 and the diffusion depth of the metal foil layer 4 toward the carrier layer 1.

TABLE 1

|  | Directly test at 25° C. | | Press-fit at 200° C. | | Press-fit at 340° C. | |
| --- | --- | --- | --- | --- | --- | --- |
|  | Diffusion depth of carrier layer to metal foil layer (μm) | Diffusion depth of metal foil layer to carrier layer (μm) | Diffusion depth of carrier layer to metal foil layer (μm) | Diffusion depth of metal foil layer to carrier layer (μm) | Diffusion depth of carrier layer to metal foil layer (μm) | Diffusion depth of metal foil layer to carrier layer (μm) |
| Embodiment 1 | 0.005-0.01 | 0.005-0.01 | 0.06-0.12 | 0.06-0.12 | 0.56-0.72 | 0.56-0.72 |
| Embodiment 2 | 0.01-0.015 | 0.01-0.015 | 0.11-0.17 | 0.11-0.17 | 0.61-0.77 | 0.61-0.77 |
| Embodiment 3 | 0.005-0.008 | 0.005-0.008 | 0.06-0.08 | 0.06-0.08 | 0.56-0.68 | 0.56-0.68 |
| Embodiment 4 | 0.012-0.018 | 0.012-0.018 | 0.13-0.18 | 0.13-0.18 | 0.63-0.78 | 0.63-0.78 |
| Embodiment 5 | 0.006-0.01 | 0.006-0.01 | 0.07-0.12 | 0.07-0.12 | 0.57-0.72 | 0.57-0.72 |
| Embodiment 6 | 0.01-0.02 | 0.01-0.02 | 0.11-0.22 | 0.11-0.22 | 0.61-0.82 | 0.61-0.82 |
| Embodiment 7 | 0.008-0.012 | 0.008-0.012 | 0.081-0.14 | 0.081-0.14 | 0.581-0.74 | 0.581-0.74 |
| Embodiment 8 | 0.008-0.012 | 0.008-0.012 | 0.081-0.14 | 0.081-0.14 | 0.581-0.74 | 0.581-0.74 |
| Embodiment 9 | 0.012-0.02 | 0.012-0.02 | 0.13-0.22 | 0.13-0.22 | 0.63-0.82 | 0.63-0.82 |
| Embodiment 10 | 0.008-0.01 | 0.008-0.01 | 0.09-0.12 | 0.09-0.12 | 0.59-0.72 | 0.59-0.72 |
| Embodiment 11 | 0.01-0.015 | 0.01-0.015 | 0.11-0.17 | 0.11-0.17 | 0.61-0.77 | 0.61-0.77 |
| Embodiment 12 | 0.012-0.018 | 0.012-0.018 | 0.13-0.2 | 0.13-0.2 | 0.63-0.8 | 0.63-0.8 |
| Embodiment 13 | 0.015-0.025 | 0.015-0.025 | 0.16-0.27 | 0.16-0.27 | 0.66-0.87 | 0.66-0.87 |
| Embodiment 14 | 0.008-0.012 | 0.008-0.012 | 0.09-0.13 | 0.09-0.13 | 0.59-0.73 | 0.59-0.73 |
| Embodiment 15 | 0.01-0.015 | 0.01-0.015 | 0.11-0.16 | 0.11-0.16 | 0.61-0.76 | 0.61-0.76 |
| Embodiment 16 | 0.006-0.01 | 0.006-0.01 | 0.07-0.11 | 0.07-0.11 | 0.57-0.71 | 0.57-0.71 |
| Embodiment 17 | 0.012-0.018 | 0.012-0.018 | 0.13-0.19 | 0.13-0.19 | 0.63-0.79 | 0.63-0.79 |
| Embodiment 18 | 0.005-0.01 | 0.005-0.01 | 0.06-0.12 | 0.06-0.12 | 0.56-0.72 | 0.56-0.72 |
| Embodiment 19 | 0.008-0.03 | 0.008-0.03 | 0.09-0.34 | 0.09-0.34 | 0.78-1.12 | 0.78-1.12 |
| Embodiment 20 | 0.0065-0.02 | 0.0065-0.02 | 0.075-0.27 | 0.075-0.27 | 0.64-0.89 | 0.64-0.89 |

TABLE 1-continued

|  | Directly test at 25° C. | | Press-fit at 200° C. | | Press-fit at 340° C. | |
| --- | --- | --- | --- | --- | --- | --- |
|  | Diffusion depth of carrier layer to metal foil layer (μm) | Diffusion depth of metal foil layer to carrier layer (μm) | Diffusion depth of carrier layer to metal foil layer (μm) | Diffusion depth of metal foil layer to carrier layer (μm) | Diffusion depth of carrier layer to metal foil layer (μm) | Diffusion depth of metal foil layer to carrier layer (μm) |
| Embodiment 21 | 0.01-0.056 | 0.01-0.056 | 0.09-0.47 | 0.09-0.47 | 0.68-1.07 | 0.68-1.07 |
| Comparative Example 1 | 4.38-4.75 | 4.38-4.75 | 5.08-5.25 | 5.08-5.25 | 6.55-7.76 | 6.55-7.76 |
| Comparative Example 2 | 3.61-3.83 | 3.61-3.83 | 4.21-4.83 | 4.21-4.83 | 5.27-5.71 | 5.27-5.71 |
| Comparative Example 3 | 1.54-1.87 | 1.54-1.87 | 2.35-2.68 | 2.35-2.68 | 2.72-2.94 | 2.72-2.94 |

Since the carrier layer 1 and the metal foil layer 4 are diffused to a certain extent under a high-temperature condition, the carrier layer 1 and the metal foil layer 4 are bonded to a certain extent. It can be seen from Table 1 that the diffusion depth of the carrier layer 1 to the metal foil layer 4 and the diffusion depth of the metal foil layer 4 toward the carrier layer 1 increase as temperature increased. Regardless of the metal foils with a carrier prepared in Embodiments 1-17 under normal temperature or high temperature conditions, the diffusion depth of the carrier layer 1 to the metal foil layer 4 and the diffusion depth of the metal foil layer 4 toward the carrier layer 1 are both less than 3 μm. Therefore, when the metal foil with a carrier is used, the carrier layer 1 and the metal foil layer 4 are prevented from diffusing mutually to cause bonding at a high temperature so that the carrier layer 1 and the metal foil layer 4 are easy to peel off. By comparing Embodiments 18 to 21, it can be seen that it is advantageous to improve the overall performance of a metal foil by limiting the process conditions of the preparation process of the metal foil within the preferred range of the present application. However, the mutual diffusion of the metal foil with a carrier prepared in Comparative Examples 1 to 2 under the high temperature condition is serious, so that the carrier layer 1 is bonded with the metal foil layer 4 to a large extent, thereby causing inconvenience in peeling off the carrier layer 1, the barrier layer 2 and the striping layer 3 from the metal foil layer 4 at the same time when the metal foil with a carrier is used. In addition, since the metal foil with a carrier prepared in Comparative Example 3 is provided with the high-temperature resistant layer 21, the diffusion depth of the carrier layer 1 to the metal foil layer 4 and the diffusion depth of the metal foil layer 4 toward the carrier layer 1 are both less than 3 μm at a high temperature. But since the metal foil with a carrier prepared in Comparative Example 3 is not provided with the metal bonding layer 22, the diffusion is therefore more severe than that of the metal foils with a carrier prepared in Embodiments 1-21.

In summary, the embodiments of the disclosure provide a metal foil with a carrier and a preparation method thereof. In the metal foil with a carrier, the carrier layer 1, the barrier layer 2, the striping layer 3, and the metal foil layer 4 are sequentially stacked; or, the carrier layer 1, the striping layer 3, the barrier layer 2, and the metal foil layer 4 are sequentially stacked. The diffusion depth of the carrier layer 1 to the metal foil layer 4 is less than or equal to 3 μm and the diffusion depth of the metal foil layer 4 toward the carrier layer 1 is less than or equal to 3 μm at a temperature of 20-400° C. The carrier layer 1 is convenient to peel off by setting the striping layer 3, and the carrier layer 1 and the metal foil layer 4 are prevented from diffusing mutually to cause bonding at a high temperature by setting the barrier layer 2, so that the carrier layer 1 and the metal foil layer 4 are easy to peel off.

The above is only the preferred embodiments of the disclosure, not intended to limit the disclosure. As will occur to those skilled in the art, the disclosure is susceptible to various modifications and changes. Any modifications, equivalent replacements, improvements and the like made within the spirit and principle of the disclosure shall fall within the scope of protection of the disclosure.

What is claimed is:

1. A metal foil with a carrier, comprising a carrier layer, a barrier layer, a striping layer, and a metal foil layer,
the carrier layer, the barrier layer, the striping layer, and the metal foil layer are sequentially stacked, the barrier layer comprises a high-temperature resistant layer and further comprises a metal bonding layer, and the metal bonding layer is disposed between the carrier layer and the high-temperature resistant layer, in order to prevent peeling delamination between the barrier layer and the carrier layer;
the high-temperature resistant layer is made of any one or more of tungsten, chromium, zirconium, titanium, molybdenum, and graphite;
the metal bonding layer is made of any one or more of copper, zinc, and manganese; or, the metal bonding layer is made of one of copper or zinc and one of nickel, iron and manganese,
the diffusion depth of the carrier layer to the metal foil layer is less than or equal to 3 μm and the diffusion depth of the metal foil layer toward the carrier layer is less than or equal to 3 μm at a temperature of 20-400° C.

2. The metal foil with a carrier according to claim 1, wherein the diffusion depth of the carrier layer to the metal foil layer is less than or equal to 1 μm and the diffusion depth of the metal foil layer toward the carrier layer is less than or equal to 1 μm.

3. The metal foil with a carrier according to claim 1, wherein the high-temperature resistant layer is a single-layer alloy structure or a multilayer structure formed by a single metal layer or a multilayer structure formed by an alloy layer and a single metal layer.

4. The metal foil with a carrier according to claim 1, wherein the thickness of the metal foil layer is less than or equal to 9 μm.

5. The metal foil with a carrier according to claim 1, wherein the metal foil layer is a copper foil or an aluminum foil; and/or, the carrier layer is copper or aluminum.

6. The metal foil with a carrier according to claim 1, wherein the roughness Rz of a face of the carrier layer close to the metal foil layer is less than or equal to 5 μm; and/or the roughness Rz of a face of the metal foil layer away from the carrier layer is less than or equal to 3.0 μm.

7. The metal foil with a carrier according to claim 1, wherein a first anti-oxidation layer is disposed on a side of the carrier layer close to the barrier layer; and/or a second anti-oxidation layer is disposed on a side of the metal foil layer away from the barrier layer.

8. A preparation method of the metal foil with a carrier according to claim 1, comprising:
(1) solution A:
S11: forming a carrier layer;
S12: forming a barrier layer on one side of the carrier layer;
S13: forming a striping layer on the barrier layer;
S14: forming a metal foil layer on the striping layer; or
(2) solution B
S21: forming a carrier layer;
S22: forming a striping layer on one side of the carrier layer;
S23: forming a barrier layer on the striping layer;
S24: forming a metal foil layer on the barrier layer,
wherein the diffusion depth of the carrier layer to the metal foil layer is less than or equal to 3 μm and the diffusion depth of the metal foil layer toward the carrier layer is less than or equal to 3 μm at a temperature of 20-400° C.

9. The preparation method according to claim 8, wherein the diffusion depth of the carrier layer to the metal foil layer is less than or equal to 1 μm and the diffusion depth of the metal foil layer toward the carrier layer is less than or equal to 1 μm.

10. The preparation method according to claim 8, wherein the barrier layer comprises a metal bonding layer and a high-temperature resistant layer stacked, and the high-temperature resistant layer is close to the striping layer.

11. The preparation method according to claim 10, comprising: forming the metal bonding layer, the high-temperature resistant layer and the striping layer independently by sputtering, wherein
optionally, the currents of the sputtering processes are each independently selected from the range of 6-12 A, and the voltages are each independently selected from the range of 300-500V.

12. The preparation method according to claim 11, wherein forming the carrier layer comprises:
S111: generating a first metal layer through a first electroplating process; and
S112: performing a second electroplating process on the surface of the first metal layer to generate a second metal layer, the first metal layer and the second metal layer forming the carrier layer;
optionally, a first plating solution for the first electroplating process comprises a copper sulfate solution with a copper content of 15-25 g/L and a PH value of 6-9, a second plating solution for the second electroplating process comprises a copper sulfate solution, sodium sulfonate, thiourea and polyethylene glycol, the copper content is 70-80 g/L, the acid content is 90-100 g/L, the mass concentration of the sodium sulfonate is 0.1-2 g/L, the mass concentration of the thiourea is 0.01-1 g/L, and the mass concentration of the polyethylene glycol is 0.1-5 g/L.

13. The preparation method according to claim 12, wherein after forming the carrier layer, the preparation method further comprises:
S113: roughening the carrier layer to obtain a roughened carrier layer; and
S114: forming a first anti-oxidation layer on the roughened carrier;
optionally, the roughening treatment process is performed with acid electroplating; and
optionally, the plating solution adopted for the acid copper plating comprises a copper sulfate solution with a copper content of 10-15 g/L, an acid content of 90-100 g/L and a molybdenum content of 600-800 PPM.

14. The preparation method according to claim 13, further comprising: after forming the carrier layer (1), annealing the carrier layer, wherein
optionally, the temperature of the annealing treatment process is 200-300° C., and the heating time is 30-300 min.

15. The preparation method according to claim 12, wherein forming the metal foil layer comprises:
sputtering a third metal layer on the striping layer in solution A or on the barrier layer in solution B; and
performing a third electroplating process on the third metal layer to form a fourth metal layer, the third metal layer and the fourth metal layer forming the metal foil layer.

16. The preparation method according to claim 15, wherein after forming the fourth metal layer, the preparation method further comprises:
performing a fourth electroplating process on the surface of the fourth metal layer to form a fifth metal layer, the fourth metal layer and the fifth metal layer forming the metal foil layer, wherein
a third plating solution for the third electroplating process comprises a copper sulfate solution with a copper content of 15-25 g/L and a PH value of 6-9, a fourth plating solution for the fourth electroplating process comprises a copper sulfate solution, sodium sulfonate, thiourea and polyethylene glycol, the copper content is 70-80 g/L, the acid content is 90-100 g/L, the mass concentration of the sodium sulfonate is 0.1-2 g/L, the mass concentration of the thiourea is 0.01-1 g/L, and the mass concentration of the polyethylene glycol is 0.1-5 g/L;
optionally, the first plating solution, the second plating solution, the third plating solution and the fourth plating solution are the same.

* * * * *